US008480917B2

(12) United States Patent
Kwon et al.

(10) Patent No.: US 8,480,917 B2
(45) Date of Patent: Jul. 9, 2013

(54) SOLID ELECTROLYTE POLYMER, POLYMER ACTUATOR USING CROSS-LINKED POLYVINYLIDENE FLUORIDE-BASED POLYMER, AND METHOD OF MANUFACTURING THE POLYMER ACTUATOR

(75) Inventors: Jong-oh Kwon, Suwon-si (KR); Seung-tae Choi, Osan-si (KR); Young-kwan Lee, Seoul (KR); Ja-Choon Koo, Seoul (KR); Su-jin Park, Daejeon (KR)

(73) Assignees: Samsung Electronics Co., Ltd., Suwon-si (KR); Sungkyunkwan University Foundation for Corporate Collaboration, Suwon-si (KR)

( * ) Notice: Subject to any disclaimer, the term of this patent is extended or adjusted under 35 U.S.C. 154(b) by 690 days.

(21) Appl. No.: 12/633,220

(22) Filed: Dec. 8, 2009

(65) Prior Publication Data

US 2010/0148635 A1 Jun. 17, 2010

(30) Foreign Application Priority Data

Dec. 12, 2008 (KR) .................. 10-2008-0126573
Jul. 10, 2009 (KR) .................. 10-2009-0063072

(51) Int. Cl.
*H02N 11/00* (2006.01)
(52) U.S. Cl.
USPC ............ 252/62.2; 252/500; 521/31; 525/356; 525/326.4; 310/800; 310/328; 204/282

(58) Field of Classification Search
USPC .................... 252/62.2, 500; 521/31; 310/328, 310/800; 204/282; 525/356, 326.4
See application file for complete search history.

(56) References Cited

U.S. PATENT DOCUMENTS

| 5,418,091 | A | * | 5/1995 | Gozdz et al. | ................. | 429/252 |
| 6,824,927 | B1 | * | 11/2004 | Katsurao et al. | ................. | 429/316 |
| 6,999,303 | B2 | | 2/2006 | Hasegawa | | |
| 7,315,106 | B2 | * | 1/2008 | Asaka et al. | ................. | 310/300 |
| 8,123,983 | B2 | * | 2/2012 | Komatsu et al. | .............. | 252/500 |
| 2009/0251027 | A1 | | 10/2009 | Kudoh | | |

FOREIGN PATENT DOCUMENTS

| CN | 1833352 A | | 9/2006 |
| EP | 1845128 | * | 10/2007 |
| EP | 1845128 A1 | | 10/2007 |
| EP | 1981034 A1 | | 10/2008 |
| JP | 9-302134 A | | 11/1997 |
| JP | 2000-311711 | * | 11/2000 |
| KR | 10-1998-047068 B1 | | 3/2003 |
| KR | 10-2003-0051606 A | | 6/2003 |
| KR | 10-2007-0008544 A | | 1/2007 |
| KR | 10-2008-0057126 A | | 6/2008 |
| WO | WO 2007088746 | * | 8/2007 |

OTHER PUBLICATIONS

European Patent Office, Communication issued May 12, 2011, in corresponding European Patent Application 09178917.2.

(Continued)

*Primary Examiner* — Carol M Koslow
(74) *Attorney, Agent, or Firm* — Sughrue Mion, PLLC (57) ABSTRACT

A solid electrolyte polymer including a cross-linked polyvinylidene fluoride (PVDF)-based polymer, and a polymer actuator including the cross-linked PVDF-based polymer and an electrolytic material.

19 Claims, 5 Drawing Sheets

OTHER PUBLICATIONS

F. Xia, Zh. Cheng, H.Xu, H. Li, Q.Zhang. G.J. Kavarnos, R.Y. Ting, G. Abdel-Sadek, K.D. Belfield: "High Electromechanical Responses in a Poly(vinylidene fluoride-trifluoroethylene-chlorotrifluoroethylene) Terpolymer" Advanced Materials, vol. 14, No. 21, Nov. 4, 2002, pp. 1574-1577, XP002577002 Weinheim ISSN: 0935-9648.

Cho M S et al: "A solid state actuator based on the PEDOT/NBR system" Sensors and Actuators B, Elsevier Sequoia S.A., Lausanne, CH LNKD-DO1:10.1016/J.SNB.2006.01.021, vol. 119, No. 2, Dec. 7, 2006, pp. 621-624, XP025112359, ISSN: 0925-4005.

Zhou D et al: "Solid state actuators based on polypyrrole and polymer-in-ionic liquid electrolytes" Electrochimica ACTA, Elsevier Science Publishers, Barking, GB LNKD-D01:10.1016/S0013-4686(03)00225-1, vol. 48, No. 14-16, Jun. 30, 2003, pp. 2355-2359, XP004431881, ISSN: 0013-4686.

Extended European search report dated May 25, 2010, issued in counterpart European Application No. 09178917.2-1214

Chinese Patent Office, Communication dated Mar. 21, 2013 issued in corresponding Chinese Patent Application No. 200911000040.1.

* cited by examiner

SOLID ELECTROLYTE POLYMER, POLYMER ACTUATOR USING CROSS-LINKED POLYVINYLIDENE FLUORIDE-BASED POLYMER, AND METHOD OF MANUFACTURING THE POLYMER ACTUATOR

CROSS-REFERENCE TO RELATED APPLICATIONS

This application claims the benefit of Korean Patent Application No. 10-2008-0126573, filed on Dec. 12, 2008, and Korean Patent Application No. 10-2009-0063072, filed on Jul. 10, 2009, in the Korean Intellectual Property Office, the disclosures of which are incorporated herein in their entirety by reference.

BACKGROUND

1. Field

One or more embodiments relate to a solid electrolyte polymer and a polymer actuator using the same, which have a broad range of applications in various fields, such as in mobile devices, polymer micro electro mechanical systems (MEMS), bio cells, solar cells, etc.

2. Description of the Related Art

Recently, polymer sensors and electrolyte polymer actuators using polymers have drawn attention due to their potential applications in various fields, and their application fields are expanding. For example, in connection with high-performance camera modules for mobile devices, an actuator is expected to be applicable in order to implement auto-focusing and zooming functions.

Electrolyte polymer actuators using liquid electrolyte necessitates a chamber for containing the liquid electrolyte, and thus the volume of the electrolyte polymer actuator may be increased. In addition, the reliability of sealing the chamber may be problematic. As alternatives to such electrolyte polymer actuators, solid electrolyte polymer actuators using acrylonitrile butadiene rubber (NBR) and polypyrrole are known.

SUMMARY

One or more embodiments include a solid electrolyte polymer layer or matrix and a polymer actuator that has excellent thermal stability and resistance to chemicals and that operates at low voltages by using the solid electrolyte polymer.

Additional aspects will be set forth in part in the description which follows and, in part, will be apparent from the description, or may be learned by practice of the presented embodiments.

According to one or more embodiments of the present invention, a polymer actuator includes a solid electrolyte polymer layer or matrix including a polyvinylidene fluoride (PVDF)-based polymer and an electrolytic material.

The polymer actuator may include a first electrode and a second electrode formed on opposite surfaces of the solid electrolyte layer, respectively.

The PVDF-based polymer may be cross-linked by a cross-linking agent.

The PVDF-based polymer includes, but is not limited to, a poly(vinylidene fluoride-trifluoroethylene-chloro trifluoro ethylene [P(VDF-TrFE-CTFE)] terpolymer or a poly(vinylidene fluoride-trifluoroethylene-chloro fluoro ethylene [P(VDF-TrFE-CFE)] terpolymer.

The first electrode may include, but is not limited to, polypyrrole (PPy), poly(3,4-ethylenedioxythiopene) (PEDOT)), polyaniline (PANI), polyacetylene, poly(p-pheneylene), polythiophene, poly(p-phenylene vinylene), or poly(thienylene vinylene). The second electrode may include, but is not limited to, polypyrrole (PPy), poly(3,4-ethylenedioxythiopene) (PEDOT), polyaniline (PANI), polyacetylene, poly(p-pheneylene), polythiophene, poly(p-phenylene vinylene), or poly(thienylene vinylene).

The cross-linking agent may include, but is not limited to, dicumyl peroxide (DCP), benzoyl peroxide, bisphenol A, methylenediamine, ethylenediamine (EDA), isopropylethylenediamine (IEDA), 1,3-phenylenediamine (PDA), 1,5-naphthalenediamine (NDA), or 2,4,4-trimethyl-1,6-hexanediamine (THDA).

The electrolytic material may include at least one selected from the group consisting of n-butyl-3-methyl imidazolium tetrafluoroborate (BMIBF), n-butyl-3-methyl imidazolium hexafluorophosphate (BMIPF6) and n-butyl-3-methyl imidazolium bis(trifluoromethanesulfonyl)imide (BMITFSI).

In another embodiment, there is provided a solid polymer film including a polymer matrix comprising a fluorine-containing polymer; and an electrolytic material dispersed in the polymer matrix. The fluorine-containing polymer contains vinylidene fluoride as an essential first structural unit, and a fluorine-containing monomer as a second structural unit, in which the second structural unit excludes vinylidene fluoride. The fluorine-containing polymer may be crosslinked. In an embodiment, the crosslinked fluorine-containing polymer is a crosslinked terpolymer comprising a vinylidene fluoride as a first structural unit, a fluorine-containing monomer as a second structural unit, and a fluorine-, chlorine- or bromine-containing monomer as a third structural unit, in which the second structural and third units exclude vinylidene fluoride.

The fluorine-containing polymer may include a vinylidene fluoride as a first structural unit; a second structural unit selected from the group consisting of trifluoroethylene, tetrafluoroethylene, and hexafluoropropylene; and a third structural unit selected from the group consisting of chlorofluoroethylene and chlorotrifluoroethylene. The crosslinked fluorine-containing polymer may be a crosslinked terpolymer selected from a poly(vinylidene fluoride-co-trifluoroethylene-co-chloro trifluoro ethylene) or a poly(vinylidene fluoride-co-trifluoroethylene-co-chlorofluoro ethylene).

The ratio of the electrolytic material:crosslinked fluorine-containing polymer may be 9:1 (w/w)-5:5 (w/w).

The polymer matrix further may contain a non-crosslinked fluorine-containing polymer.

In yet another embodiment, there is provided a laminate of a first electrode, a second electrode, and a solid polymer film disposed between the first electrode and the second electrode, wherein the solid polymer film is in contact with the first electrode at its first surface and the solid polymer film is in contact with the second electrode at its second surface that is opposite to the first surface. The solid polymer film includes: a polymer matrix comprising a fluorine-containing polymer; and an electrolytic material dispersed in the polymer matrix, wherein the fluorine-containing polymer contains vinylidene fluoride as an essential first structural unit, and a fluorine-containing monomer as a second structural unit, in which the second structural unit excludes vinylidene fluoride. In an embodiment, the solid polymer film includes: a polymer matrix containing a crosslinked fluorine-containing polymer; and an electrolytic material dispersed in the polymer matrix, wherein the fluorine-containing polymer is a terpolymer including vinylidene fluoride as a first structural unit, a fluorine-containing monomer as a second structural unit, and a fluorine-, chlorine- or bromine-containing monomer as a third structural unit, in which the second and third structural units exclude vinylidene fluoride.

According to one or more embodiments, a method of manufacturing a polymer electrolyte is provided. The method includes providing a crosslinked fluorine-containing polymer layer; coating a solution of a conductive polymer on a surface of the crosslinked fluorine-containing polymer to produce a laminate of a first conductive polymer layer, the crosslinked fluorine-containing polymer layer, and a second conductive polymer layer, in this order; and injecting an electrolytic material into the crosslinked fluorine-containing polymer layer, wherein the fluorine-containing polymer is a terpolymer comprising vinylidene fluoride as a first structural unit, a fluorine-containing monomer as a second structural unit, and a fluorine-, chlorine- or bromine-containing monomer as a third structural unit, in which the second and third structural units exclude vinylidene fluoride.

The crosslinked fluorine-containing polymer layer may be produced by subjecting a fluorine-containing polymer to crosslinking reaction using a crosslinking agent, wherein the crosslinking is conducted by providing a solution containing the fluorine-containing polymer and the crosslinking agent; forming a layer from the solution; and thermally treating the layer to form a layer of the crosslinked fluorine-containing polymer.

In another embodiment, the method may include: preparing a polyvinylidene fluoride (PVDF)-based polymer solution using a PVDF-based polymer in powder form and adding a cross-linking agent into the PVDF-based polymer solution; forming a PVDF-based polymer layer from the PVDF-based polymer solution including the cross-linking agent, and thermally treating the PVDF-based polymer layer to form a cross-linked PVDF-based polymer layer; coating a conductive polymer solution on the cross-linked PVDF-based polymer layer; and injecting an electrolyte into the cross-linked PVDF-based polymer layer.

The conductive polymer may include, but is not limited to, polypyrrole (PPy), 3,4-ethylenedioxythiopene (PEDOT), polyaniline (PANI), polyacetylene, poly(p-pheneylene), polythiophene, poly(p-phenylene vinylene), or poly(thienylene vinylene).

According to one or more embodiments of the present invention, a solid electrolyte polymer includes a cross-linked PVDF-based polymer and an electrolytic material.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description.

The term "a fluorine-containing polymer" used herein is intended to mean a polymer comprising a vinylidene fluoride as a first structural unit, a fluorine-containing monomer as a second structural unit, and a fluorine-, chlorine- or bromine-containing monomer as a third structural unit, in which the second structural units excludes vinylidene fluoride. The term "polyvinylidene fluoride (PVDF)-based polymer," as used herein, is intended to mean a polymer which includes vinylidene fluoride unit as an essential structural (or constitutional) unit. The PVDF-based polymer also may include, as an additional structural unit, a fluorine-containing monomeric units such as trifluoroethylene (TrFE), tetrafluoroethylene (TFE), perfluoro(methyl vinyl ether), bromotrifluoroethylene, chlorofluoroethylene, chlorotrifluoroethylene, or hexafluoropropylene. Therefore, throughout the application, the terms "fluorine-containing polymer" and "PVDF-based polymer" are sometimes interchangeably used to indicate a copolymer or terpolymer containing vinylidene fluoride as a structural unit and additional structural units.

In an exemplary embodiment, the PVDF-based polymer may be a terpolymer. The term "terpolymer" used herein is intended to mean a polymer containing three or more structural units or monomeric units. The PVDF-based terpolymer according to an embodiment contains vinylidene fluoride as a first structural unit, and two or more other structural units. The PVDF-based polymer, thus, may include a vinylidene-fluoride (VDF) as a first structural unit; trifluoroethylene (TrFE) or tetrafluoroethylene (TFE) as a second structural unit; and tetrafluoroethylene, vinyl fluoride, perfluoro(methyl vinyl ether), bromotrifluoroethylene, chlorofluoroethylene, chlorotrifluoroethylene, or hexafluoropropylene, as a third structural unit. For example, the PVDF-based polymer may be a fluorine-containing terpolymer which contains VDF as a first structural unit, a fluorine-containing monomer (e.g., trifluoroethylene, tetrafluoroethylene, hexafluoropropylene, or the like) as a second structural unit, and a chlorine and fluorine-containing monomer (e.g., chlorofluoroethylene, chlorotrifluoroethylene, or the like) as a third structural unit. In an exemplary embodiment, the PVDF-based terpolymer (fluorine-containing terpolymer) may include, but is not limited to, P(VDF(vinylidene-fluoride)-co-TrFE(trifluoroethylene)-co-CTFE(chlorotrifluoroethylene)), or P(VDF(vinylidene-fluoride)-co-TrFE(trifluoroethylene)-co-CFE(chlorofluoroethylene)). The PVDF-based polymer may have an average molecular weight of 10,000 to 900,000. In an exemplary embodiment, the PVDF-based polymer may have an average molecular weight of 50,000 to 900,000. In another exemplary embodiment, the PVDF-based polymer may have an average molecular weight of 50,000 to 500,000.

The PVDF-based polymer, which is a copolymer or terpolymer, may be an alternating copolymer (or terpolymer) where the structural units are regularly alternating, a periodic copolymer (or terpolymer) where the structural units are arranged in a repeating sequence, a statistical or random copolymer (or terpolymer), or a block copolymer (or terpolymer) containing three or more homopolymer subunits are linked by covalent bonds. Also, the copolymer or terpolymer may be linear or branched.

When high thermal stability and high resistance to chemicals (e.g., low solubility in a solvent) are required, the PVDF-based polymer may be subject to cross-linking using a cross-linking agent. The cross-linking agent may be incorporated in a resulting cross-linked PVDF-based polymer in an amount up to about 10 wt % based on the molecular weight of the PVDF-based polymer. In an exemplary embodiment, the cross-linking agent may be incorporated in the PVDF-based polymer in an amount up to about 5 wt % based on the molecular weight of the PVDF-based polymer.

Examples of the cross-linking agent may include, but is not limited to, dicumyl peroxide (DCP), benzoyl peroxide, bisphenol A, methylenediamine, ethylenediamine (EDA), isopropylethylenediamine (IEDA), 1,3-phenylenediamine (PDA), 1,5-naphthalenediamine (NDA), 2,4,4-trimethyl-1,6-hexanediamine (THDA), and the like.

The cross-linked PVDF-based polymer may have different physicochemical properties from its parent (i.e., prior to cross-linking) PVDF-based polymer. For example, the cross-linked PVDF may be examined to determine whether the PVDF-based polymer is cross-linked employing, for example, a differential scanning calorimeter (DSC) analysis, a dynamic mechanical analysis (DMA) analysis, or a solubility test. For example, in DSC analysis, the amounts of crystallization (H) at a DSC peak in a PVDF-based polymer before and after the crosslinking are compared and the amount of crystallization (H) in the cross-linked PVDF-based polymer is lower than that of the uncross-linked PVDF-based polymer. In DMA analysis, the glass transition temperatures (Tg) of a PVDF-based polymer prior to and after the cross-linking reaction are measured and the Tg in the cross-linked PVDF polymer increases. Also, the cross-linked PVDF-based polymer shows increased loss modulus and storage modulus values than the PVDF-based polymer prior to the cross-linking.

In order to determine whether the PVDF-based polymer is cross-linked, a solubility test may be performed. When the PVDF-based polymer is cross-linked, chains of the polymer molecules are linked together and thus the chains are not dissolved in the solvent used for performing cross-linking. When the resulting PVDF-based polymer after cross-linking reaction was added to a solvent such as methyl isobutyl ketone (MIBK) or methyl ethyl ketone (MEK), the resulting cross-linked PVDF-based polymer showed a decreased solubility and thus it could be determined that the cross-linking was accomplished.

The cross-linked PVDF-based polymer may be advantageously used in an actuator. The actuator may include a laminate which is composed of (i) a first electrode; (ii) a second electrode; and (iii) a polymer matrix including the cross-linked PVDF-based polymer and an electrolytic material, the polymer matrix being disposed between the first electrode and a second electrode. The polymer matrix is sometime referred to as "a solid electrolyte polymer layer," throughout the application. Hereinafter, the solid electrolyte polymer layer or polymer matrix including a cross-linked polyvinylidene fluoride (PVDF)-based polymer and an electrolytic material, and a polymer actuator using the solid electrolyte polymer will be described in detail with reference to the accompanying drawings. In the drawings, the thicknesses and widths of layers or regions are exaggerated for clarity.

Figure 1:
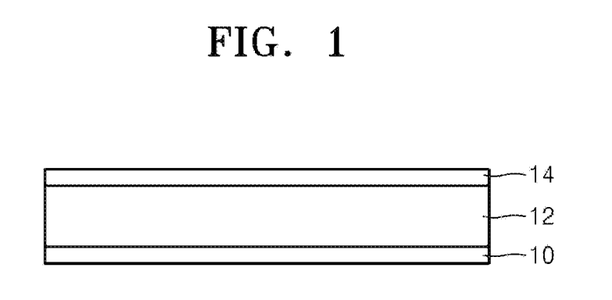
FIG. 1 is a sectional view illustrating a structure of a polymer actuator employing a solid electrolyte polymer film, wherein the solid electrolyte polymer film contains a cross-linked polyvinylidene fluoride (PVDF)-based polymer, according to an embodiment.

FIG. 1 is a schematic sectional view illustrating a structure of a polymer actuator which uses a solid electrolyte polymer layer containing a cross-linked polyvinylidene fluoride (PVDF)-based polymer.

Referring to FIG. 1, a solid electrolyte polymer layer/film 12 is laminated between a first electrode 10 and a second electrode 14. The solid electrolyte polymer layer 12 includes a polymer matrix formed of a cross-linked PVDF-based polymer, and an electrolytic material dispersed in the matrix. The cross-linked PVDF-based polymer may be a cross-linked PVDF-based terpolymer. The polymer matrix may further include a non-crosslinked PVDF-based polymer, e.g., non-crosslinked PVDF-based terpolymer.

Examples of the cross-linked PVDF-based terpolymer may include, but is not limited to, a poly(vinylidene fluoride-trifluoroethylene-chloro trifluoro ethylene) [P(VDF-TrFE-CTFE)] terpolymer, a poly(vinylidene fluoride-trifluoroethylene-chloro fluoro ethylene) [P(VDF-TrFE-CFE)] terpolymer, and the like. The cross-linked PVDF-based polymer may be a mixture of various types of cross-linked PVDF-based polymers. Here, the mixture of various types of polymers means a physical blend of the polymers without covalent bonds between them. The cross-linked PVDF-based polymer also may be blended (without covalent bonds) with a non-crosslinked PVDF-based polymer, such as non-crosslinked PVDF-based terpolymers.

Examples of suitable electrolytic materials that may be included in the solid electrolyte polymer layer 12 may include, but is not limited to, at least one material selected from the group consisting of n-butyl-3-methyl imidazolium tetrafluoroborate (BMIBF), n-butyl-3-methyl imidazolium hexafluorophosphate (BMIPF6), and n-butyl-3-methyl imidazolium bis(trifluoromethanesulfonyl)imide (BMITFSI).

The ratio of the electrolytic material and the polymer (cross-linked PVDF-based polymer alone or in combination with non-crosslinked PVDF-based polymer) may be 9:1 (w/w)-5:5 (w/w). In an embodiment, the ratio may be 8:2 (w/w)-6:4 (w/w). In another embodiment, the ratio may be 8:2 (w/w)-7:3 (w/w).

The first electrode 10 and the second electrode 14 may be formed of a conductive polymer such as polypyrrole (PPy), poly(3,4-ethylenedioxythiophene) (PEDOT), polyaniline (PANI), polyacetylene, poly(p-pheneylene), polythiophene, poly(p-phenylene vinylene), poly(thienylene vinylene), or the like.

The thickness of the actuator (or laminate of the first electrode 10, the polymer layer 12 and the second electrode 14) and the thickness of the individual layers are not limited. In one embodiment, the first electrode and the second electrode each have a thickness of several micrometers to several millimeters, for example, 1 μm to 1 mm. In an embodiment, the first electrode and the second electrode each have a thickness of 1 μm to 100 μm. In yet another embodiment, the thickness of each of the first electrode and the second electrode may be 5 μm to 50 μm. In an embodiment, the thickness of the electrolyte polymer layer may be several micrometers to several millimeters, for example, 1 μm to 1 mm. In an embodiment, the first electrode and the second electrode each have a thickness of 1 μm to 100 μm. In yet another embodiment, the thickness of the electrolyte polymer layer may be 5 μm to 50 μm The operating principle of the polymer actuator is as follows. As a voltage is applied through the first electrode 10 and/or the second electrode 14, the solid electrolyte polymer layer 12 is oxidized, and thus charged with positive (+) charges. In addition, negative (−) charges in the solid electrolyte polymer layer 12 migrate towards the first electrode 10 or the second electrode 14, and the solid electrolyte polymer layer 12 swells and bends so that the polymer actuator starts to operate. The direction in which the polymer actuator bends may be selectively varied according to the direction in which a voltage is applied.

Figure 2:
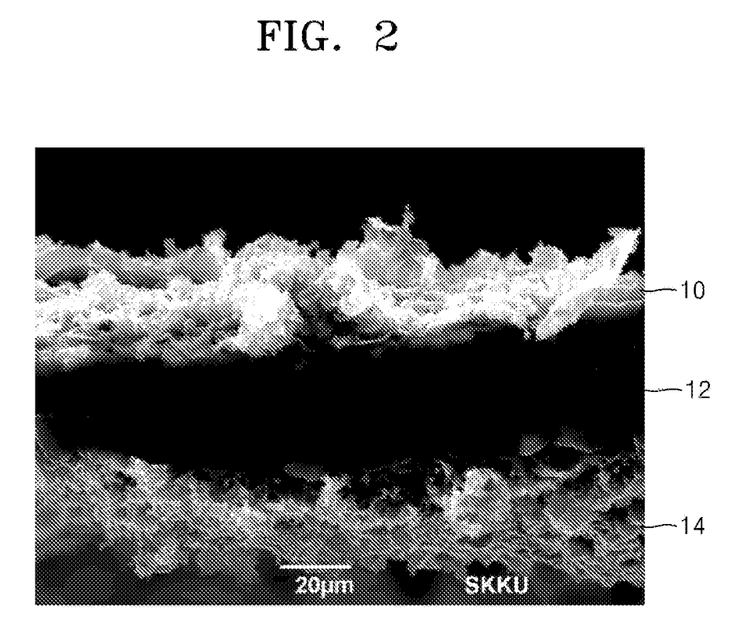
FIG. 2 is a microscopic image of a cross-section of the polymer actuator using the cross-linked PVDF-based polymer.

FIG. 2 is a cross-sectional image of an exemplary polymer actuator using a PVDF-based polymer cross-linked using hexanediamine (THDA) as a cross-linking agent. Referring to FIG. 2, a first electrode 10 and a second electrode 14 are formed of PPy, which is a conductive polymer, to a thickness of about 20 μm to about 25 μm, respectively. In the exemplary polymer actuator shown in FIG. 2, a solid electrolyte polymer layer 12 is formed of a cross-linked P(VDF-TrFE-CTFE) terpolymer to a thickness of about 30 μm to about 35 μm. The solid electrolyte polymer layer 12 includes an electrolytic material, such as n-butyl-3-methyl imidazolium bis(trifluoromethanesulfonyl)imide (BMITFSI).

Hereinafter, a method of manufacturing a polymer actuator using a cross-linked PVDF-based polymer according to an embodiment will be described with reference to FIGS. 3A through 3K. It should be noted that the process explained hereinafter with reference to FIGS. 3A-3K is an exemplary method to produce the polymer actuator, the invention is not limited thereto.

Figure 3A:
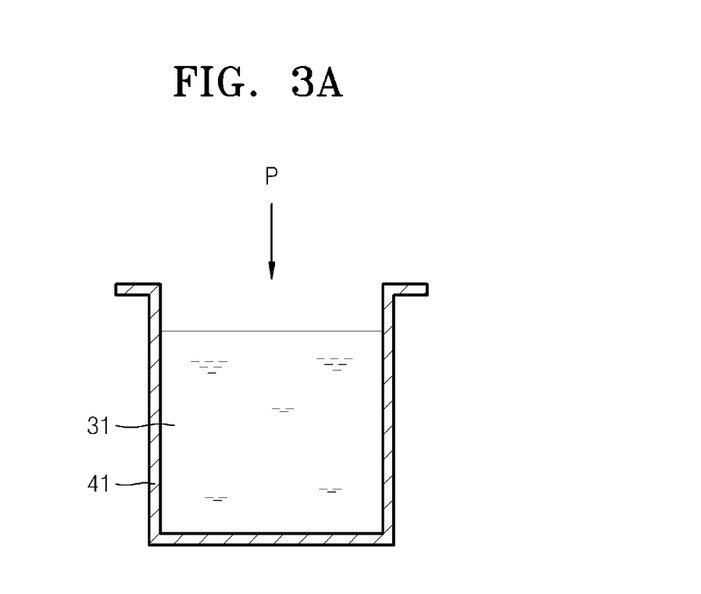
FIGS. 3A through 3K illustrate a method of manufacturing a polymer actuator using a cross-linked PVDF-based polymer, according to an embodiment.

Referring to FIG. 3A, a PVDF-based polymer powder (P) is put into a container 41 containing a solvent 31. For example, the PVDF-based polymer powder (P) and the solvent 31 are mixed at room temperature or while being heated, thereby obtaining a solution or dispersion 32 containing 5 wt % PVDF-based polymer (see FIG. 3B).

Figure 3B:
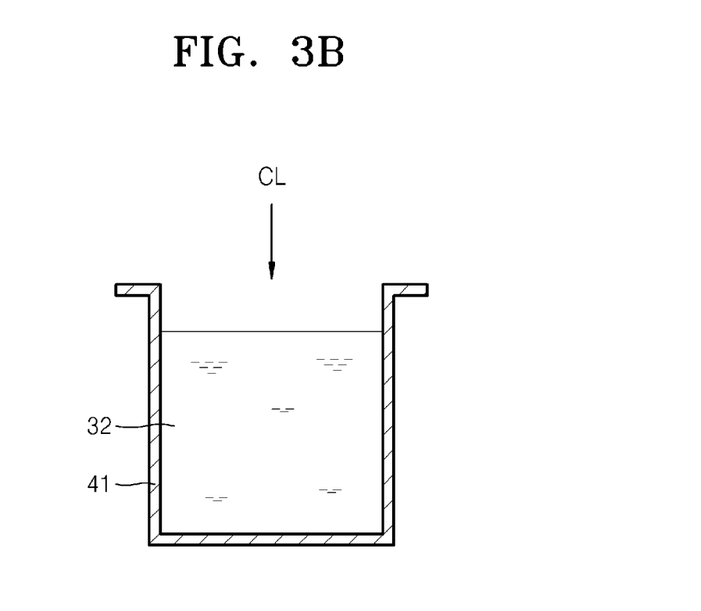
Figure 3C:
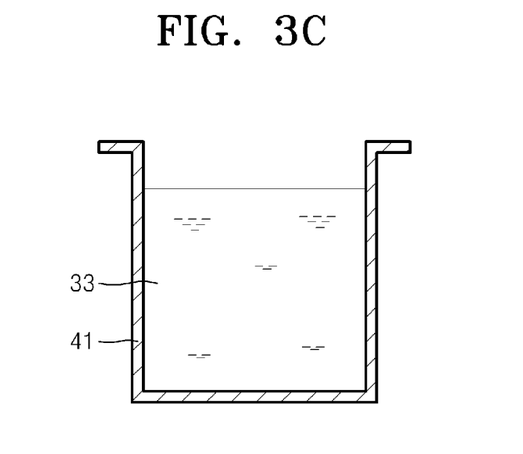

Referring to FIGS. 3B and 3C, a cross-linking agent (CL) is put into the PVDF-based polymer solution 32. Examples of the cross-linking agent (CL) may include, but is not limited to, dicumyl peroxide (DCP), benzoyl peroxide, bisphenol A, methylenediamine, ethylenediamine (EDA), isopropylethylenediamine (IEDA), 1,3-phenylenediamine (PDA), 1,5-naphthalenediamine (NDA), 2,4,4-trimethyl-1,6-hexanediamine (THDA), and the like. For example, a 0.1-10 wt % (based on the weight of the PVDF-based polymer) of cross-linking agent (CL) may be put into the container 41 containing the PVDF-based polymer solution 32, and then mixed at room temperature or while being heated, thereby obtaining a mixture 33 of the cross-linking agent (CL) and the PVDF-based polymer solution 32.

Figure 3D:
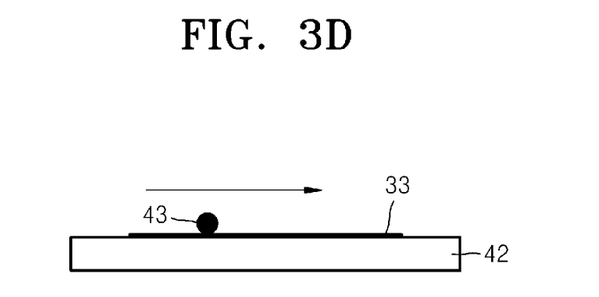

Referring to FIG. 3D, the mixture 33 of the cross-linking agent (CL) and the PVDF-based polymer solution 32 is coated on a plate 42 using a bar-coater 43, according to, for example, a solution casting method, to form a layer. Next, the solvent 31 is evaporated.

Figure 3E:
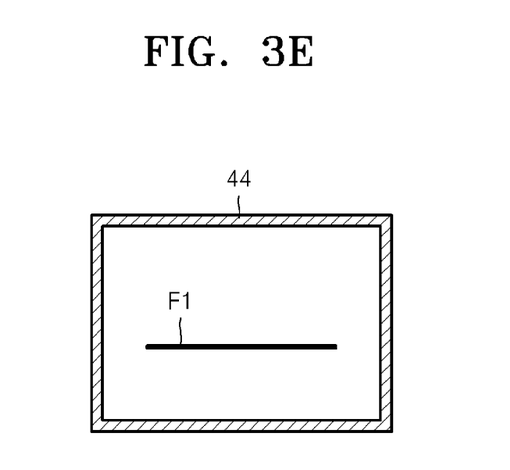

Referring to FIG. 3E, the PVDF-based polymer layer F1 including the cross-linking agent CL is heated in a heating chamber 44, for example, to a temperature of about 160 to about 170° C. so that the PVDF-based polymer layer F1 is cross-linked.

Whether the PVDF-based polymer layer F1 has been cross-linked by the cross-linking agent can be determined using dynamic mechanical analysis (DMA), differential scanning calorimeter (DSC) analysis, or a solubility test. Comparing the glass transition temperatures (Tg) of the PVDF-based polymer layer F1 before cross-linking and after being cross-linked, which are obtained as a result of DMA analysis of the PVDF-based polymer layer F1, the glass transition temperature (Tg) of the PVDF-based polymer layer F1 is raised after being cross-linked. Comparing the loss modulus and the storage modulus between the PVDF-based polymer layer F1 at the initial state before cross-linking and the cross-linked PVDF-based polymer layer, both the loss modulus and the storage modulus of the cross-linked PVDF-based polymer layer are greater than those of the PVDF-based polymer layer F1 at the initial state before cross-linking. Comparing the amounts (H) of crystal phase of the PVDF-based polymer layer F1 at the initial state before cross-linking and the cross-linked PVDF polymer layer, which are obtained as a result of the DSC analysis, the amount of crystal phase of the cross-linked PVDF polymer layer is less than that of the PVDF-based polymer layer F1 at the initial state before cross-linking. This is because chains in the cross-linked PVDF-based polymer layer are entangled.

The cross-linked PVDF-based polymer layer that is confirmed as having been cross-linked by the cross-linking agent is subjected to the following processes for manufacturing the polymer actuator.

Figure 3F:
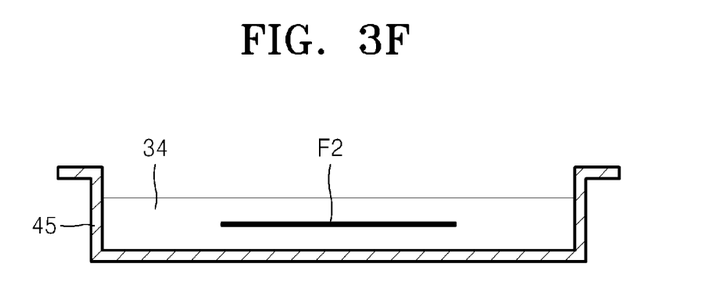
Figure 3G:
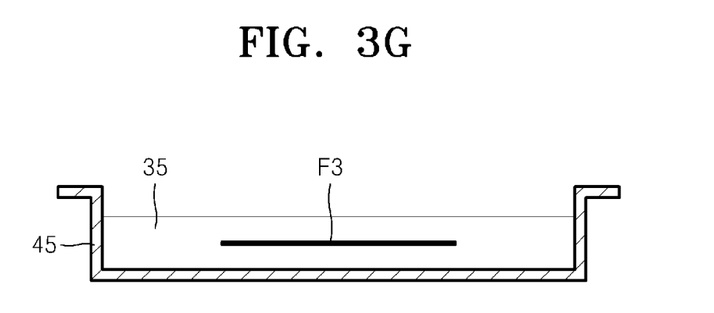

Referring to FIG. 3F, the cross-linked PVDF-based polymer layer F2 is immersed in a solution 34 containing a conductive polymer in a container 45 in order to coat a conductive polymer layer on the cross-linked PVDF-based polymer layer F2. The conductive polymer layer coated on the cross-linked PVDF-based polymer layer F2 functions as an electrode. Examples of suitable conductive polymers may include, but is not limited to, polypyrrole (PPy), 3,4-ethylenedioxythiopene (PEDOT), polyaniline (PANI), polyacetylene, poly(p-pheneylene), polythiophene, poly(p-phenylene vinylene), poly(thienylene vinylene), and the like. For example, the cross-linked PVDF-based polymer layer F2 may be immersed in a solution 34 of pyrrole, which is used as a conductive polymer. In this regard, the cross-linked PVDF-based polymer layer F2 may be immersed in the pyrrole solution for several minutes to tens of minutes. Then, the cross-linked PVDF-based polymer layer F2 is removed from the container 45. Next, the pyrrol solution remaining on the surface of the cross-linked PVDF-based polymer layer F2 is removed using, for example, a filter paper, or the like. In order to render polymerization of pyrrole monomers into polypyrrole, the cross-linked PVDF-based polymer layer F2 onto which the pyrrole solution is soaked is put into the container 45 containing an oxidant 35 for polymerization, as illustrated in FIG. 3G. Examples of the oxidant 35 may include a metal compound, iron toluene sulfonate (FTS), $FeCl_3$, $AuCl_3$, and the like. For example, the cross-linked PVDF-based polymer layer F2 may be immersed in a 2M $FeCl_3$ solution for polymerization. Finally, a cross-linked PVDF-based polymer layer F3 coated with the conductive polymer is obtained.

Figure 3H:
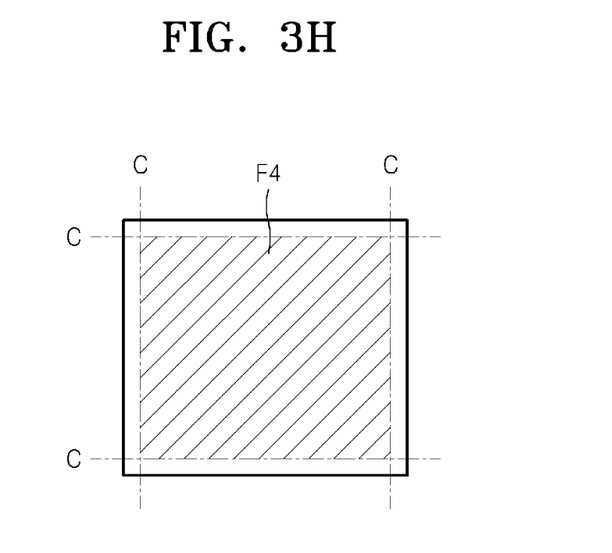
Figure 3I:
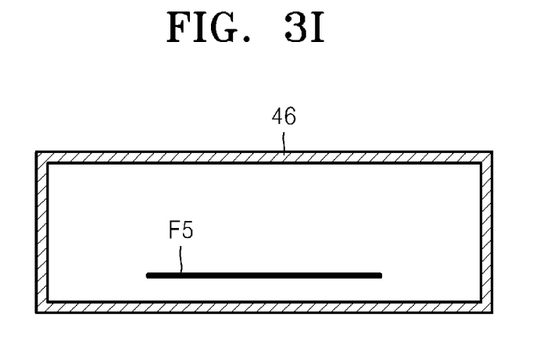

Referring to FIG. 3H, a cross-linked PVDF-based polymer layer F4 withdrawn from the container 45, the cross-linked PVDF-based polymer layer F4 coated with the conductive polymer, are cut at its four sides along lines C, and washed with, for example, methanol, to remove the unreacted pyrrole monomers remaining on the cross-linked PVDF-based polymer layer F4. Next, referring to FIG. 3I, the cross-linked PVDF-based polymer layer F4 is dried in a vacuum oven 46 at room temperature, thereby obtaining a laminate F5 of conductive polymer layer/cross-linked PVDF polymer layer/conductive polymer, for example, a laminate of PPy layer/PVDF polymer layer/PPy layer.

Figure 3J:
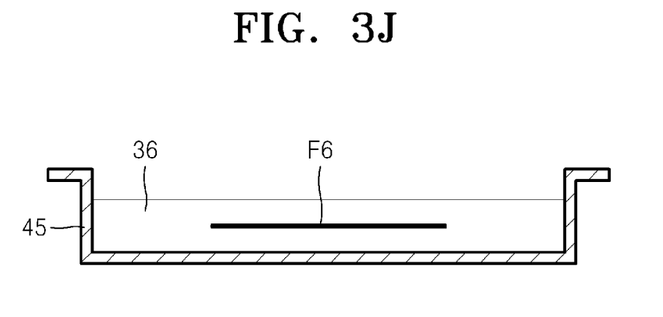
Figure 3K:
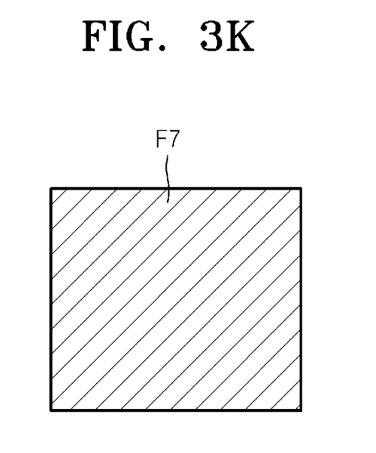

Referring to FIG. 3J, in order to inject an electrolytic material into the PVDF-based polymer layer of the laminate F5, a piece of the PVDF-based polymer layer laminate F5 formed above is immersed in a liquid electrolyte 36 in a container 45. The liquid electrolyte 36 is prepared by dissolving an electrolyte in a solvent. Examples of the electrolytic material may include n-butyl-3-methyl imidazolium tetrafluoroborate (BMIBF), n-butyl-3-methyl imidazolium hexafluorophosphate (BMIPF6), n-butyl-3-methyl imidazolium bis(trifluoromethanesulfonyl)imide (BMITFSI), and the like. Examples of the solvent may include propylene carbonate (PC), acetonitrile, methyl benzoate, methyl benzoate ethylene carbonate (EC), and the like. In order to allow the liquid electrolyte 36 to sufficiently soak into the PVDF-based polymer layer of the laminate F5, heat or pressure may be applied during the immersion. Finally, a PVDF-based polymer layer F6 into which the liquid electrolyte 36 is soaked is obtained. Referring to FIG. 3K, the solvent of the liquid electrolyte 36 used for the immersion is evaporated, thereby resulting in a PVDF-based polymer actuator F7, in which the electrolytic material is dispersed in the PVDF-based polymer layer.

In order to test a motion of the polymer actuator manufactured as described above, the polymer actuator was cut to a size of 5×30 mm². The polymer actuator tested is a laminate of a first electrode of PPy layer; a second electrode of PPy layer; and a solid electrolyte polymer layer containing a crosslinked P(VDF-TrFE-CTFE) terpolymer (crosslinking agent: DCP) and BMITFSI as an electrolytic material. In addition, cyclic voltammetry was conducted on the polymer actuator using a potentiostat (PARSTAT 2263) in a range of about −5V to about 5V at 500 mV/sec. The displacement (in millimeters) of the polymer actuator was measured using a laser displacement measuring system (KEYENCE LK-081, available from KEYENCE Co., Japan). As a result, a displacement of 5 mm or greater, or a displacement of about 10 mm or about 15 mm in some cases, occurred.

As described above, according to the one or more of the above embodiments of the present invention, a solid electrolyte polymer including a cross-linked PVDF-based polymer may have excellent thermal stability and resistance to chemicals. In addition, a polymer actuator including the solid electrolyte polymer may operate at a low voltage.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A polymer film comprising:
   a polymer matrix comprising a crosslinked fluorine-containing polymer; and
   an electrolytic material dispersed in the polymer matrix,
   wherein the crosslinked fluorine-containing polymer is a crosslinked terpolymer comprising vinylidene fluoride as a first structural unit, a fluorine-containing monomer as a second structural unit, and a fluorine-, chlorine- or bromine-containing monomer as a third structural unit, in which the second and third structural units exclude vinylidene fluoride, and
   wherein the electrolytic material comprises at least one selected from the group consisting of n-butyl-3-methyl imidazolium tetrafluoroborate, n-butyl-3-methyl imidazolium hexafluorophosphate, and n-butyl-3-methyl imidazolium bis(trifluoromethanesulfonyl)imide.

2. The polymer film of claim 1, wherein the fluorine-containing polymer comprises a vinylidene fluoride as a first structural unit; a second structural unit selected from the group consisting of trifluoroethylene, tetrafluoroethylene, and hexafluoropropylene; and a third structural unit selected from the group consisting of chlorofluoroethylene and chlorotrifluoroethylene.

3. The polymer film of claim 2, wherein the crosslinked fluorine-containing polymer is a crosslinked terpolymer selected from a poly(vinylidene fluoride-co-trifluoroethylene-co-chloro trifluoro ethylene) or a poly(vinylidene fluoride-co-trifluoroethylene-co-chlorofluoro ethylene).

4. The polymer film of claim 1, wherein the ratio of the electrolytic material:crosslinked fluorine-containing polymer is 9:1 (w/w)-5:5 (w/w).

5. The polymer film of claim 1, wherein the polymer matrix further comprises a non-crosslinked fluorine-containing polymer.

6. A laminate of a first electrode, a second electrode, and a polymer film disposed between the first electrode and the second electrode, wherein the polymer film is in contact with the first electrode at its first surface and the polymer film is in contact with the second electrode at its second surface that is opposite to the first surface,
   wherein the polymer film comprises:
   a polymer matrix comprising a crosslinked fluorine-containing polymer; and
   an electrolytic material dispersed in the polymer matrix,
   wherein the crosslinked fluorine-containing polymer is a terpolymer comprising vinylidene fluoride as a first structural unit, a fluorine-containing monomer as a second structural unit, and a fluorine-, chlorine- or bromine-containing monomer as a third structural unit, in which the second and third structural units exclude vinylidene fluoride, and
   wherein the electrolytic material comprises at least one selected from the group consisting of n-butyl-3-methyl imidazolium tetrafluoroborate, n-butyl-3-methyl imidazolium hexafluorophosphate, and n-butyl-3-methyl imidazolium bis(trifluoromethanesulfonyl)imide.

7. The laminate of claim 6, wherein the crosslinked fluorine-containing polymer is a crosslinked terpolymer selected from a poly(vinylidene fluoride-co-trifluoroethylene-co-chloro trifluoro ethylene) or a poly(vinylidene fluoride-co-trifluoroethylene-co-chlorofluoro ethylene).

8. The laminate of claim 6, wherein the ratio of the electrolytic material:crosslinked fluorine-containing polymer is 9:1 (w/w)-5:5 (w/w).

9. The laminate of claim 6, wherein the polymer matrix further comprises a non-crosslinked fluorine-containing polymer.

10. The laminate of claim 6, wherein the first electrode and the second electrode each independently comprises polypyrrole, poly(3,4-ethylenedioxythiopene), polyaniline, polyacetylene, poly(p-pheneylene), polythiophene, poly(p-phenylene vinylene), or poly(thienylene vinylene).

11. The laminate of claim 6, wherein the crosslinked fluorine-containing polymer comprises a cross-linking unit in its molecule, the cross-linking unit is selected from the group consisting of dicumyl peroxide, benzoyl peroxide, bisphenol A, methylenediamine, ethylenediamine, isopropylethylenediamine, 1,3-phenylenediamine, 1,5-naphthalenediamine, and 2,4,4-trimethyl-1,6-hexanediamine.

12. A polymer film comprising:
   a polymer matrix comprising a crosslinked fluorine-containing polymer and a non-crosslinked fluorine-containing polymer; and
   an electrolytic material dispersed in the polymer matrix,
   wherein the crosslinked fluorine-containing polymer contains vinylidene fluoride as an essential first structural unit, and a fluorine-containing monomer as a second structural unit, in which the second structural units excludes vinylidene fluoride, and
   wherein the electrolytic material comprises at least one selected from the group consisting of n-butyl-3-methyl imidazolium tetrafluoroborate, n-butyl-3-methyl imidazolium hexafluorophosphate, and n-butyl-3-methyl imidazolium bis(trifluoromethanesulfonyl)imide.

13. A laminate of a first electrode, a second electrode, and a polymer film disposed between the first electrode and the second electrode, wherein the polymer film is in contact with the first electrode at its first surface and the polymer film is in contact with the second electrode at its second surface that is opposite to the first surface,
   wherein the polymer film comprises:
   a polymer matrix comprising a fluorine-containing polymer; and an electrolytic material dispersed in the polymer matrix, wherein the crosslinked fluorine-containing polymer contains vinylidene fluoride as an essential first structural unit, and a fluorine-containing monomer as a second structural unit, in which the second structural units excludes vinylidene fluoride, and wherein the electrolytic material comprises at least one selected from the group consisting of n-butyl-3-methyl imidazolium tetrafluoroborate, n-butyl-3-methyl imidazolium hexafluorophosphate, and n-butyl-3-methyl imidazolium bis(trifluoromethanesulfonyl)imide.

14. A polymer actuator comprising a first electrode, a second electrode, and a polymer film disposed between the first electrode and the second electrode, wherein the polymer film comprises:

a polymer matrix comprising a crosslinked fluorine-containing polymer; and an electrolytic material dispersed in the polymer matrix, wherein the crosslinked fluorine-containing polymer is a terpolymer comprising vinylidene fluoride as a first structural unit, a fluorine-containing monomer as a second structural unit, and a fluorine-, chlorine- or bromine-containing monomer as a third structural unit, in which the second and third structural units exclude vinylidene fluoride, and wherein the electrolytic material comprises at least one selected from the group consisting of n-butyl-3-methyl imidazolium tetrafluoroborate, n-butyl-3-methyl imidazolium hexafluorophosphate, and n-butyl-3-methyl imidazolium bis(trifluoromethanesulfonyl)imide.

15. The polymer actuator of claim 14, wherein the crosslinked fluorine-containing polymer is a crosslinked terpolymer selected from a poly(vinylidene fluoride-co-trifluoroethylene-co-chloro trifluoro ethylene) or a poly(vinylidene fluoride-co-trifluoroethylene-co-chlorofluoro ethylene).

16. The polymer actuator of claim 14, wherein the ratio of the electrolytic material:crosslinked fluorine-containing polymer is 9:1 (w/w)-5:5 (w/w).

17. The polymer actuator of claim 14, wherein the polymer matrix further comprises a non-crosslinked fluorine-containing polymer.

18. The polymer actuator of claim 14, wherein the first electrode and the second electrode each independently comprise polypyrrole, poly(3,4-ethylenedioxythiopene), polyaniline, polyacetylene, poly(p-phenylene), polythiophene, poly(p-phenylene vinylene), or poly(thienylene vinylene).

19. The polymer actuator of claim 14, wherein the crosslinked fluorine-containing polymer comprises a cross-linking unit in its molecule, the cross-linking unit is selected from the group consisting of dicumyl peroxide, benzoyl peroxide, bisphenol A, methylenediamine, ethylenediamine, isopropylethylenediamine, 1,3-phenylenediamine, 1,5-naphthalenediamine, and 2,4,4-trimethyl-1,6-hexanediamine.

* * * * *